(12) United States Patent
Lewis et al.

(10) Patent No.: US 7,702,978 B2
(45) Date of Patent: Apr. 20, 2010

(54) SOFT ERROR LOCATION AND SENSITIVITY DETECTION FOR PROGRAMMABLE DEVICES

(75) Inventors: David Lewis, Toronto (CA); Ninh D. Ngo, Palo Alto, CA (US); Andy L. Lee, San Jose, CA (US); Joseph Huang, Morgan Hill, CA (US)

(73) Assignee: Altera Corporation, San Jose, CA (US)

( * ) Notice: Subject to any disclaimer, the term of this patent is extended or adjusted under 35 U.S.C. 154(b) by 316 days.

(21) Appl. No.: 11/737,089

(22) Filed: Apr. 18, 2007

(65) Prior Publication Data

US 2007/0283193 A1 Dec. 6, 2007

Related U.S. Application Data

(60) Provisional application No. 60/793,946, filed on Apr. 21, 2006.

(51) Int. Cl.
*G06F 11/00* (2006.01)
*G01R 31/28* (2006.01)

(52) U.S. Cl. .............................. 714/725; 714/3; 714/37; 714/48

(58) Field of Classification Search ................ 714/724, 714/725, 746, 758, 807, 5, 37, 39, 48, 52, 714/38, 3, 7
See application file for complete search history.

(56) References Cited

U.S. PATENT DOCUMENTS

| | | | |
|---|---|---|---|
| 4,369,511 A | 1/1983 | Kimura et al. | |
| 5,835,695 A * | 11/1998 | Noll | 714/6 |
| 5,867,422 A | 2/1999 | John | |
| 5,870,350 A | 2/1999 | Bertin et al. | |
| 6,104,211 A | 8/2000 | Alfke | |
| 6,242,767 B1 | 6/2001 | How et al. | |
| 6,553,523 B1 | 4/2003 | Lindholm et al. | |
| RE38,651 E | 11/2004 | Sung et al. | |
| 7,328,377 B1 * | 2/2008 | Lewis et al. | 714/48 |
| 7,363,422 B2 | 4/2008 | Perego et al. | |
| 7,529,992 B1 * | 5/2009 | Teig et al. | 714/725 |
| 7,542,324 B1 | 6/2009 | Choe | |
| 2004/0124876 A1 | 7/2004 | Plants | |

* cited by examiner

*Primary Examiner*—Phung M Chung
(74) *Attorney, Agent, or Firm*—Townsend and Townsend and Crew LLP

(57) ABSTRACT

Circuits, methods, and apparatus that detect whether a soft error that occurs in stored configuration data is a false positive that can be ignored such that reloading configuration data or other remedial measures are not unnecessarily performed. One example provides an integrated circuit including an error detection circuit and a sensitivity processor. The error detection circuit detects the presence of errors. The sensitivity processor determines whether a detected error can be ignored, or whether remedial action, such as providing an error flag, reconfiguring the device, or correcting the error, should be commenced. The sensitivity processor may make this determination based on whether the error occurred in a memory cell that configures unused circuitry. The sensitivity processor may make use of an error log to track known errors that may be ignored, so that this determination does not need to be done each time the configuration data is checked.

21 Claims, 6 Drawing Sheets

SOFT ERROR LOCATION AND SENSITIVITY DETECTION FOR PROGRAMMABLE DEVICES

CROSS-REFERENCES TO RELATED APPLICATIONS

This application claims the benefit of U.S. provisional patent No. 60/793,946, filed Apr. 21, 2006, which is incorporated by reference. This application is related to U.S. patent application Ser. No. 11/407,519 filed Apr. 19, 2006, which is incorporated by reference.

BACKGROUND

The present invention relates generally to programmable devices, and more particularly to systems and methods for detecting configuration errors in programmable devices. Programmable devices typically include thousands of programmable logic elements that are made up of logic gates or look-up tables that can be configured to perform user-defined logic functions. Programmable devices often also include a number of specialized circuits adapted to specific functions, such as adders, multiply and accumulate circuits, phase-locked loops, and memory. These programmable logic elements and specialized circuits can be interconnected using programmable interconnect lines. The programmable interconnect lines selectively route connections among the programmable logic elements and specialized circuits. By configuring the combination of programmable logic elements, specialized circuits, and programmable interconnect lines, a programmable device can be adapted to perform virtually any type of information processing function.

The configuration of a programmable device is typically controlled by configuration data stored in a set of configuration RAM (CRAM) cells or configuration memory. Typically, the data in CRAM cells includes entries for look-up tables, control signals for multiplexers included in programmable logic elements, values that control the programmable interconnect lines, and values that control other aspects of a programmable device, such as modes of operation for the programmable device.

The configuration data is typically stored in a non-volatile memory, such as flash memory or ROM that is within the same chip package as the programmable device or on an external configuration device connected to the programmable memory device. At power-up, reset, or other appropriate conditions, this configuration data is loaded from the flash memory into the CRAM cells of the programmable device to configure the programmable device.

Each new generation of programmable devices are made up of transistors that are smaller than their predecessors due to advances in manufacturing processes. As the physical dimensions of CRAM cells decrease, they become more susceptible to spontaneous "soft errors." Soft errors may be induced by background radiation, such as alpha particles or cosmic rays, and result in CRAM cells spontaneously changing state from "0" to "1," or vice versa. Soft errors are so named because erroneous information in a memory cell can be corrected by reprogramming, as opposed to hard errors where a memory cell is permanently nonfunctional. Since the function of a programmable device is determined by data stored in CRAM cells, even a single change in a CRAM cell's state can change or disable the function of the programmable device. Additionally, as programmable devices become more complicated, additional CRAM cells are required to store configuration data. This further increases the frequency of soft errors.

Previous methods to correct soft errors include the use of error detection circuitry that reads configuration data and from CRAM cells and determines the presence of errors. Upon the detection of an error, the error detection circuitry typically raises an error signal that causes the programmable device to reload its configuration data and be reconfigured for correct operation. In another approach, error correction circuitry that can correct known errors is also included on a device. This circuitry can be used to correct configuration data in the CRAM without reloading the entire set of configuration data.

Many applications running on a programmable device do not use large portions of the device's circuitry. For example, a typical application might only use one-half of the included circuitry, meaning only approximately half of the CRAM cells are needed to configure the operation of programmable logic elements, specialized circuits, and programmable interconnect lines that are used by the application. The remaining CRAM cells, which may be set to some known logic value, do not affect the functions of the programmable device. The CRAM cells that control programmable logic elements, specialized circuits, and programmable interconnect lines that are unused by the application are referred to as unused CRAM cells. Soft errors in unused CRAM cells are insignificant and can often be ignored.

Because error detection circuitry does not distinguish between used and unused CRAM cells, programmable devices employing convention techniques generally reload configuration data upon detection of any error in the CRAM cells. However, as large portions of the CRAM may be unused by applications of the programmable device, many of these soft errors are "false positives" that have no effect on the functionality of the programmable device. Thus, programmable devices often unnecessarily reload configuration data due to false positives, which diminishes the performance of the programmable device—due to downtime during the loading of configuration data—and increased power consumption—due to unnecessary loading and storing of configuration data.

Therefore, what are needed are circuits, methods, and apparatus that detect false positive soft errors so as to avoid unnecessary remedial activities such as error correction or device reconfiguration.

SUMMARY

Accordingly, embodiments of the present invention provide circuits, methods, and apparatus that detect whether a soft error in stored configuration data is a false positive that can be ignored such that reloading configuration data or other remedial measures are not unnecessarily performed.

An exemplary embodiment of the present invention provides an integrated circuit having an error detection circuit and a sensitivity processor. The error detection circuit detects the presence of a soft error in stored configuration data. The sensitivity processor determines whether a detected soft error can be ignored, or whether remedial action, such as providing an error flag, reconfiguring the device, or correcting the error, needs to be commenced. The sensitivity processor may make this determination based on whether the error occurred in a memory cell that configures unused circuitry. The sensitivity processor may make use of an error log to track known errors that may be ignored, so that this determination does not need to be done each time the configuration data is checked.

In a specific embodiment of the present invention, a bitstream is received by and stored on a programmable device. This bitstream includes configuration data that is used to configure programmable logic elements, specialized circuits, and programmable interconnect lines that form the programmable device. The bitstream further includes error check bits that are typically derived from the configuration data. These error check bits can be used to determine if one or more of the configuration bits have been corrupted and have become a so-called soft error. The error check bits may be used to determine the presence and location of a soft error. Typically, the precise location, that is, the precise CRAM cell, of a soft error is determined, though in some circumstance or some embodiments of the present invention, the location of a soft error is found to within a number or group of CRAM cells. Further, in the event of multiple errors, the location of these errors may not be determinable.

In one specific embodiment of the present invention, the bitstream further includes sensitivity data. This sensitivity data indicates whether certain circuits on the programmable device are needed or used by the application that the programmable device is being configured for. More specifically, each bit of sensitivity data indicates whether an error in or more CRAM cells will not have a sufficiently detrimental effect on overall circuit performance such that the error may be ignored. If an error results in an erroneous configuration that does not have a sufficiently detrimental effect on device performance, the error may be ignored. This allows remedial measures, such as providing error indications, performing error correction, and undergoing device reconfiguration, to be avoided.

In various embodiments of the present invention, the criteria for when circuitry is erroneously configured such that it has a sufficiently detrimental effect on device performance may vary. For example, sensitivity may be based on whether a circuit is used by an application. In a specific embodiment of the present invention, if a programmable logic element is not used by an application, the application is not sensitive to an error in a CRAM cell that is used to configure that programmable logic element. However, in other embodiments, some errors in unused circuits may adversely affect other circuits that are used. For example, such an error may load a used driver unnecessarily, may increase power dissipation, or have such other effect that performance is undesirably reduced. Accordingly, in various embodiments of the present invention, these and other criteria may be used in generating the sensitivity data.

For example, each bit of sensitivity data may indicate the sensitivity of an application to an error in one CRAM cell. However, this requires the use of a large sensitivity database. Accordingly, in a specific embodiment of the present invention, each sensitivity bit indicates the sensitivity to an application to an error in any one CRAM cell in a group of CRAM cells.

In a specific embodiment of the present invention, a programmable logic element includes a look-up table portion and a register portion. Accordingly, the sensitivity to an error in a group of CRAM cells used to configure a look-up table or register portion of a programmable logic element may be tracked with one bit. Alternately, one sensitivity bit may indicate the sensitivity of an application to an error in any one CRAM cell used to configure a programmable logic element, or a group of logic elements, such as a logic array block.

Also, in this specific embodiment, routing is configured using routing multiplexers. These multiplexers may be under the control of typically 6-15 CRAM cells. Accordingly, the sensitivity of an application to an error in any bit in such a group of CRAM cells may be tracked with a sensitivity bit. Alternatively, the sensitivity to an error in a CRAM cell for a group of routing multiplexers can be tracked with a sensitivity bit. For example, the local routing multiplexers in a logic array block may be tracked with a sensitivity bit. Again, in any of these embodiments of the present invention, sensitivity of an application to an error in a CRAM bit may be determined by whether the CRAM bit configures circuitry that is used by the application.

If an application is sensitive to an error that occurs, the sensitivity processor may provide a flag to an external device that causes the programmable device to be reconfigured. If the application is not sensitive to an error, it may be ignored. In either event, it may be desirable to track errors for data collection and analysis by the application.

Once it has been determined that a configuration bit that is in error can be ignored, it is desirable to not have to make the same determination each time configuration data is checked. Accordingly, another exemplary embodiment of the present invention includes an error log that tracks soft errors that may be ignored. When an error is detected, the log is checked to see if the error can be ignored. If the error has not been logged, the sensitivity data is consulted to see if the error can be ignored. If an error can be ignored, the error is then logged for future reference.

In various embodiments of the present invention, error correction circuitry is also included. If an application is sensitive to an error, further action beyond correction may be necessary, such as a soft or hard reset. Also, if multiple errors occur, a reset may be needed if the correction circuitry cannot correct the multiple errors. Even if an application is not sensitive to an error, such errors should typically be corrected, lest they accumulate and cause conditions where later errors cannot be corrected. Again, in either event, it may be desirable to track errors for analysis by the application.

Various embodiments of the present invention may incorporate one or more of these or the other features described herein. A better understanding of the nature and advantages of the present invention may be gained with reference to the following detailed description and the accompanying drawings.

DESCRIPTION OF EXEMPLARY EMBODIMENTS

Figure 1:
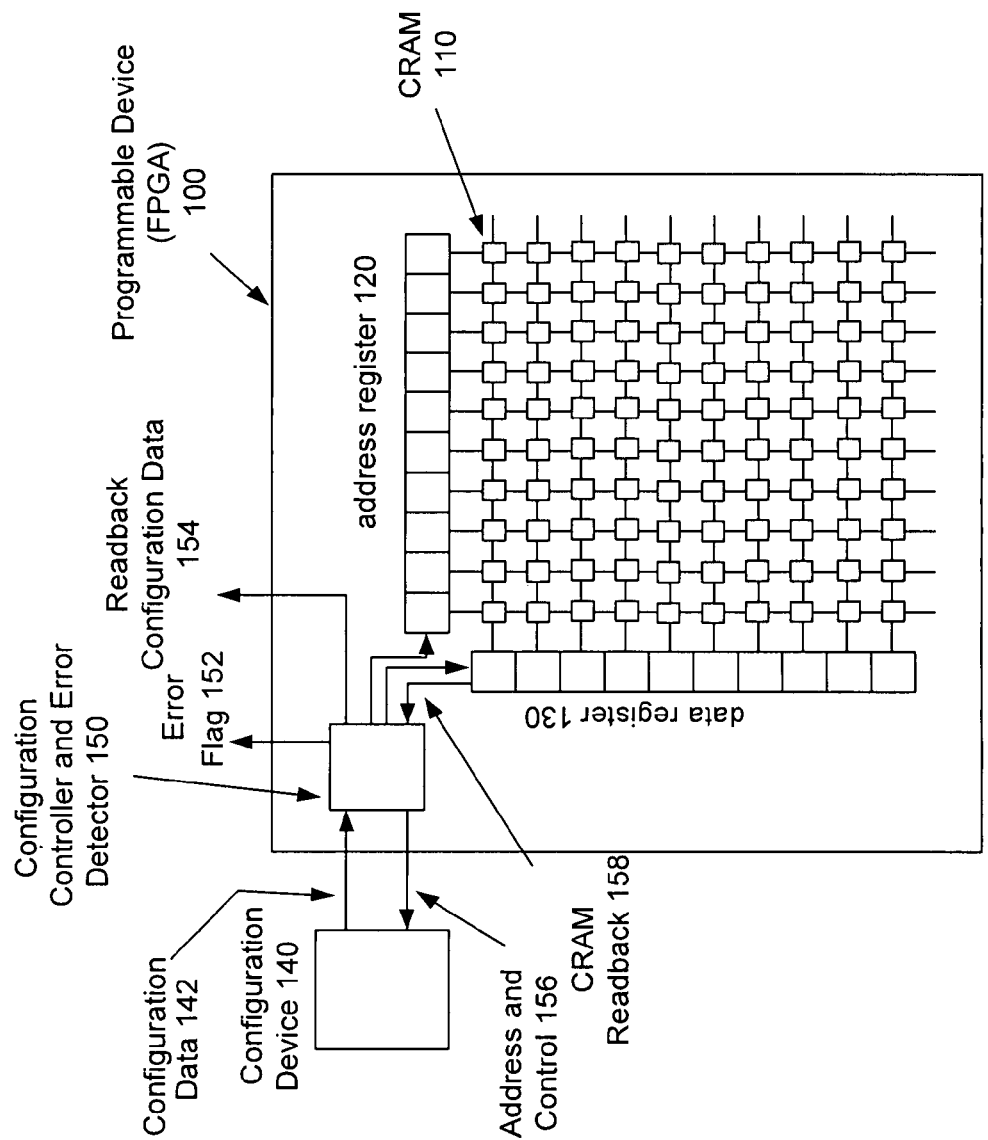
FIG. 1 illustrates an example configuration memory and associated circuitry for a programmable device.

FIG. 1 is an overview of a CRAM array 110 and programming structure for a typical programmable device 110. A programmable device 100 contains a number of CRAM cells organized in an array 110 of rows and columns. An address register 120 contains a set of lines each of which addresses a column of CRAM cells 110. A data register 130 contains data to write to or program a column of CRAM cells 110, or data that has been read back from a column of CRAM cells 110.

When data is written to the CRAM cells 110, a configuration controller 150 reads or accepts configuration data from a configuration memory, which may either be on a separate chip in the form of a configuration device 140, or contained on the same chip as the programmable device 100. Data is read from the configuration memory and provided to the data register 130. When a complete column of data is available, one column is programmed by strobing one of the lines addressed by the address register 120.

In a specific embodiment of the present invention, the address register 120 is preset to all 0's and a single 1 is shifted to select the column to be programmed. In other variations, the address register may use different encodings. The programmable device may be arranged into smaller blocks of address or data; the data may be read in a single bit or several bits at a time; as well as other possible variations.

After the CRAM cells are written to, the configuration controller 150 may periodically read back the CRAM data and check for errors. The configuration controller 150 again sequences through one or more of the columns and reads back data into the data register 130. After each column is read, the configuration controller 150 uses this data to perform some step of the error detection computation, typically by shifting the data into the configuration controller 150 to perform a CRC check. Alternatively it may compute error detecting or correcting codes on blocks of CRAM cells that comprise various subsets of the columns or the data in the rows. Alternatively, blocks of CRAM cells, which may span any number of rows and columns of CRAM cells, may also contain an error detecting or correcting code. Alternatively, the regions may be interleaved across multiple rows and columns so that the CRAM cells in a given error correction block are not necessarily adjacent.

If an error is detected, the configuration controller 150 may raise an error flag 152, which can be a logic signal that is either internal or external to the programmable device 100. External logic (not shown) monitoring the programmable device 100 can use this to reconfigure the programmable device 100. In the event of a detected error, the state of the programmable device 100 can not be trusted because it is unknown how much time has passed since the error occurred and its detection, and consequently, the state of the programmable device 100 may be corrupted in an unpredictable manner. Reconfiguring and initializing the programmable device 100 is the often only option in these circumstances.

Further variations of the example programmable device 100 may also include error-correcting circuitry to correct the CRAM 110 contents internally, but this does not address the problem of false positives. Additionally, some configuration controllers 150 may also provide an ability to read back the configuration data and drive it off the programmable device, for example on line 154.

Again, if a soft error is a false positive, that is, it is an error in a CRAM cell that configures an unused circuit, that error may be ignored. Thus, it is undesirable to reconfigure a device following the detection of an error where the error is a false positive. Accordingly, an exemplary embodiment of the present invention reduces unnecessary reconfigurations of programmable devices by ignoring soft errors in CRAM that do not significantly affect the operation of the programmable device. An embodiment of the present invention first uses error check bits to detect and locate soft errors that potentially affect the operation of the device. After that, it is determined whether the soft error is one that significantly affects device performance to an undesirable degree, or whether it is one that can be ignored.

In an embodiment of the present invention, an error correction code (ECC) unit performs an error check on a block or subset of bits of configuration data stored in the CRAM. Although this subset could conceivably be all the CRAM devices in a programmable device, typical error correcting codes can correct only a single error, so it is advantageous to divide the programmable device into a number of smaller blocks of configuration data, each of which can tolerate a single soft error.

In an embodiment of the present invention, the ECC unit is able to identify the location of a single error. Further embodiments can also identify, at least with a high probability, whether more than one error has occurred. This allows the programmable device to tolerate many soft errors, provided that the number of soft errors in each block does not exceed the abilities of the ECC unit to identify the location or locations of the errors.

Figure 2:
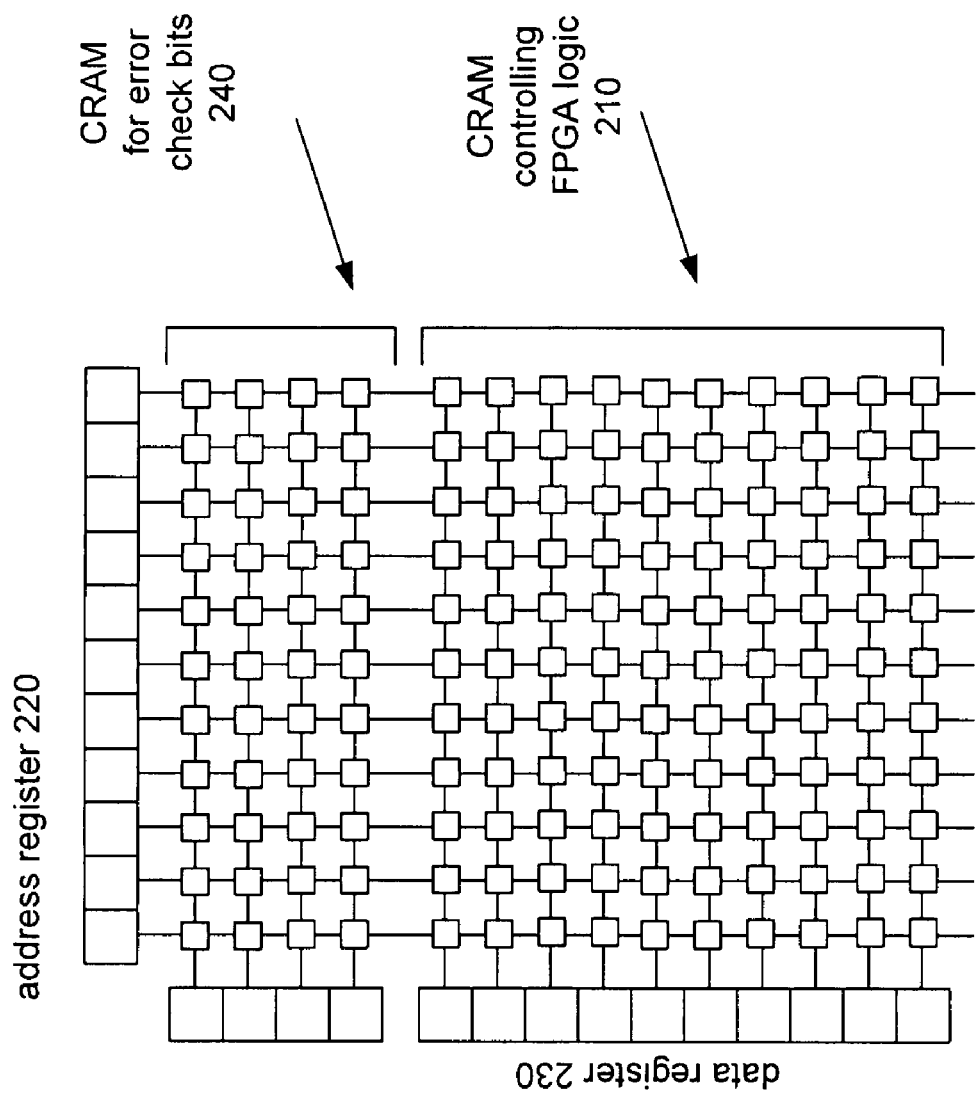
FIG. 2 illustrates an example of configuration memory for a programmable device according to an embodiment of the invention.

FIG. 2 illustrates an example configuration memory of a programmable device according to an embodiment of the invention. This figure includes CRAM cells 210 that are used to configure a device, address registers 220, data registers 230, and CRAM cells 240 that are used to store error check bits.

In this embodiment of the present invention, each block of CRAM cells 210 has an associated collection of one or more additional CRAM cells 240 that are used to store error check bits. These CRAM cells 240 are not used for controlling any part of a programmable device, but are used to store error check bits for that block of CRAM cells 210. In one embodiment of the present invention, the subset of locations is a column of CRAM cells 210, and the error check bits extend vertically beyond what would normally be the end of the column. Error check bits are stored in these additional CRAM cells 240. Other variations are possible and include parts of a column, more than one column, or any region of CRAM cells that are efficient to treat as a related block of data.

Figure 3:
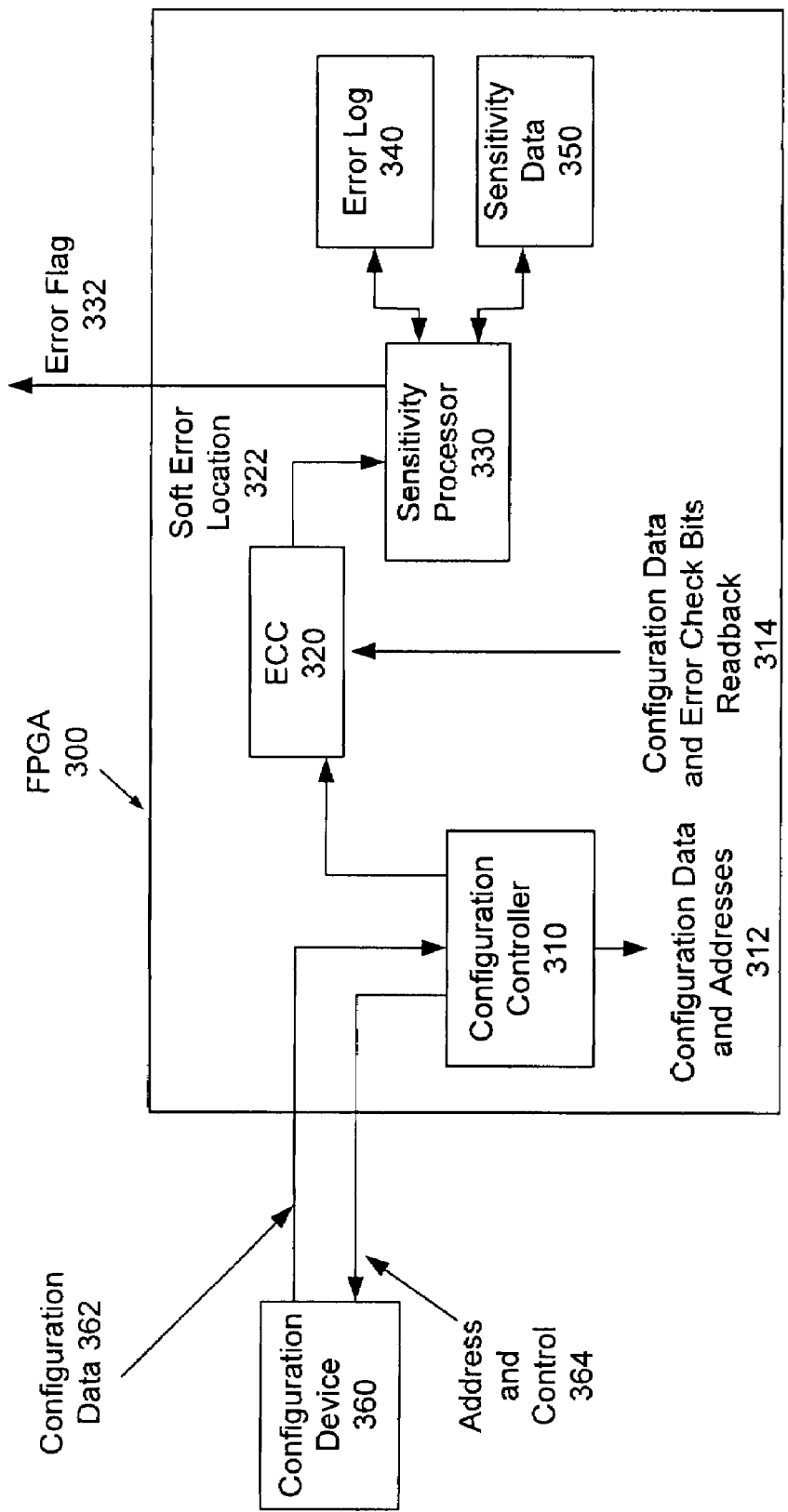
FIG. 3 illustrates an example of a soft error detection unit and associated circuitry according to an embodiment of the invention.

FIG. 3 is a block diagram including a soft error detection unit and associated circuitry according to an embodiment of the invention. This figure includes an FPGA or other programmable device 300 that further includes a configuration controller 310, error correction code unit 320, sensitivity processor 330, optional error log 340, and sensitivity data database or memory 350, as well as an external configuration device 360.

During configuration, the configuration controller 310 reads configuration data from configuration device 360. The configuration controller 310 writes configuration data to CRAM cells (not shown). After configuration, data in the CRAM cells is periodically checked for soft errors. This can be done by the ECC unit 320 reading configuration data and error check bits from the CRAM cells.

If a soft error is detected, the ECC unit 320 determines the location of the error. Some types of ECC calculations may be able to identify more than one error location, so the reference to "location" in this disclosure should be taken to mean one or more locations. In an embodiment, the location specified by the code does not need to be as precise as the exact index of the failing bit, but may be precise enough to provide some benefit in localizing the error sufficiently to be able to take advantage of the statistics, in the sense that there is a good probability that an error corresponds to a location that does not affect the operation of the user circuit.

In one embodiment of the present invention, the location will be the exact index of a particular failing bit. In another embodiment, it might be the index of a set of bit pairs that comprise a column. Thus it should be noted that there are two distinct levels of granularity described in the above paragraphs: (1) the amount of configuration data that forms the block size used in each ECC calculation (2) the level of resolution in identifying a location where a soft error has occurred within a block. In a specific embodiment of the present invention, the location of an error comprises both the block number with the failing bit and the location of the bit within that block.

As the error checking circuit performs an error calculation on each block, it may raise a flag on line 332 if an error occurs. As described above, when an error is found, the ECC unit 320 also determines the location of the error. In the case of an error correcting code such as a Hamming code, this may naturally be part of the ECC calculation. In the case of a CRC calculation, it may take further computations to determine the location of the error. The ECC unit may also signal if an error or errors have occurred that are beyond the capabilities of the ECC unit to identify, for example a double bit error in a ECC unit that can only identify the location of a single bit error, but can detect double errors.

After the location of the error is determined, an embodiment of the ECC unit 320 passes the flags and the location of the soft error to a sensitivity processor 330. The sensitivity processor 330 accesses the sensitivity data memory 350 with an address corresponding with the location of the detected error. The resulting sensitivity data is a value that specifies if the user circuit is sensitive or not to an error in the specified location.

Again, various criteria can be used to define sensitivity. In a specific embodiment of the present invention, an error is considered to be sensitive if the error is one that is sufficiently detrimental to the operation of the programmable device, as currently configured, such that remedial actions should undertaken and that the error should not be ignored. Since different designs or applications utilize different portions of the programmable device, the sensitivity data for the programmable device varies accordingly. In an embodiment of the present invention, the sensitivity data is precomputed by software in conjunction with the determination of the programmable device's configuration data and loaded into the sensitivity data memory. In a specific embodiment of the present invention, each bit of sensitivity data corresponds to a number of CRAM cells. When an error in any one of the number of CRAM cells would be sufficiently detrimental to the operation of the device that remedial actions should be taken, the corresponding sensitivity data bit is set to indicate that the design is sensitive to a soft error in one of these CRAM cells.

The sensitivity processor 330 analyzes the retrieved sensitivity data to determine if the detected soft error is sensitive, that is, is the error sufficiently detrimental to the operation of the programmable device that remedial action is needed, as currently configured. The sensitivity processor 330 may then assert a signal on line 332 to indicate the presence of a sensitive error. If the error is not sensitive, an optional embodiment of the present invention logs the error in an optional error log memory 340 so that further occurrences of the error will not cause repetitive evaluations of the same sensitivity data. In this embodiment, the sensitivity processor 330 consults the error log 340 prior to accessing the sensitivity data memory 350, and the sensitivity processor 330 only accesses the sensitivity data memory if the error has not previously been detected and entered in the error log memory 340.

The CRAM cells may be mapped to data in the sensitivity data memory 350 in a number of ways. In one embodiment of the present invention, the sensitivity data memory 350 allocates a sensitivity bit for each CRAM cell. However, this requires a great deal of sensitivity data memory 350. Accordingly, in other embodiments of the present invention, the sensitivity data memory 350 allocates a sensitivity bit for each region, where a region comprises some number of CRAM cells. In this embodiment of the present invention, the sensitivity data memory 350 access is made with the most significant bits of the CRAM cell address. For example, the ECC computation may identify the precise location of a bit error, but the sensitivity data may store a sensitivity bit for each 2*2 rectangle of CRAMs, so only part of the bit error location needs to be used to determine the corresponding location of its associated sensitivity data.

In further embodiments, the regions associated with sensitivity bits may vary in size and may correspond with specific components of the programmable device, such as programmable interconnect lines or programmable logic elements. For example, a region associated with a sensitivity bit may be a portion of a programmable logic element, such as a look-up table or register portion of a programmable logic element. Alternately, a region may be a programmable logic element, or a group of logic elements. Other regions may include a routing multiplexer or group of routing multiplexers, such as all the routing multiplexers associated with a logic array block. In still further embodiments, more elaborate data structures, such as trees or hash tables may be used to represent regions of configuration memory by the sensitivity data.

Often, if one CRAM bit in a logic element is used, the logic element is configured and is needed as part of the user's design. In such a situation, each CRAM bit in the logic element is needed. Accordingly, in an embodiment of the present invention, a coarse grain region corresponding to one or more logic elements may be used to implement the invention using a very small amount of memory for sensitivity data, thereby allowing the sensitivity data to be stored on chip, though in some embodiments, this data is stored off chip, for example in the configuration device 360. In a specific embodiment of the present invention, the routing configuration can be excluded from the sensitivity data under the assumption that every logic block or LAB in a programmable device contains at least some routing that is used, such that the use of sensitivity data for the routing configuration is redundant. In contrast, there may be many completely unused logic blocks or LABs that can take advantage of the sensitivity information.

In a further embodiment of the present invention, the optional error log 340 is preferably located on the die to reduce the need to access off chip memory, but the sensitivity data memory may be located either on-chip, in the case of a relatively small amount of data, or off-chip, possibly in the configuration device 360.

In further embodiments in which the soft error location may be identified to a single bit, or in variations that permit small regions of the programmable device CRAM to be reconfigured, the sensitivity processor may reload configuration data of the failing bit or regions of bits to repair the error, so that subsequent errors do not exceed the detection capability of the system.

Embodiments of programmable devices with redundancy can have at least two distinct effects on the location information described by the ECC processor. First, the error location may correspond to a logical location rather than a physical location, since the data may be shifted during programming the device. For example, data may be shifted by a row to avoid a bad row, (a row comprising many adjacent LABs, typically 20 to 200) so a given bit may be physically placed in one of two LAB rows. In this case the data may be read back in the same manner that it is written, skipping the bad row, so this shifting will not be visible in the data stream.

In contrast, the second aspect of redundancy may cause the data to be processed such that bits in the configuration data may be altered or moved depending on the defect location such that the contents of the CRAM is not easily predicted. For example, one specific embodiment alters the contents of routing bit pairs depending on the location and distance to a defective row. In these devices, it is possible to use regions that are at least one pair of bits in size.

Embodiments of the invention may be implemented entirely in hard logic (i.e. dedicated specialized logic of the programmable device) on the programmable device or soft logic (i.e. logic created using the programmable logic resources of the programmable device), or a combination of soft and hard logic. For example, a combined embodiment could place the ECC logic to identify the error location in hard logic and provide signals to the core of the programmable device that encoded this information. An example sensitivity processor 330 can be constructed from soft logic in the programmable device core, allowing essentially arbitrary choice of algorithms in the mapping from error location to the sensitivity data memory address. The sensitivity data may be located on chip, typically if it is small enough to fit in the embedded memory blocks, or may be located off chip as mentioned above. The sensitivity processor 330 may be triplicated to avoid soft errors in the programmable device from causing a failure in the error detecting logic, and the sensitivity data may use error correction to prevent soft errors from causing a failure.

Figure 4:
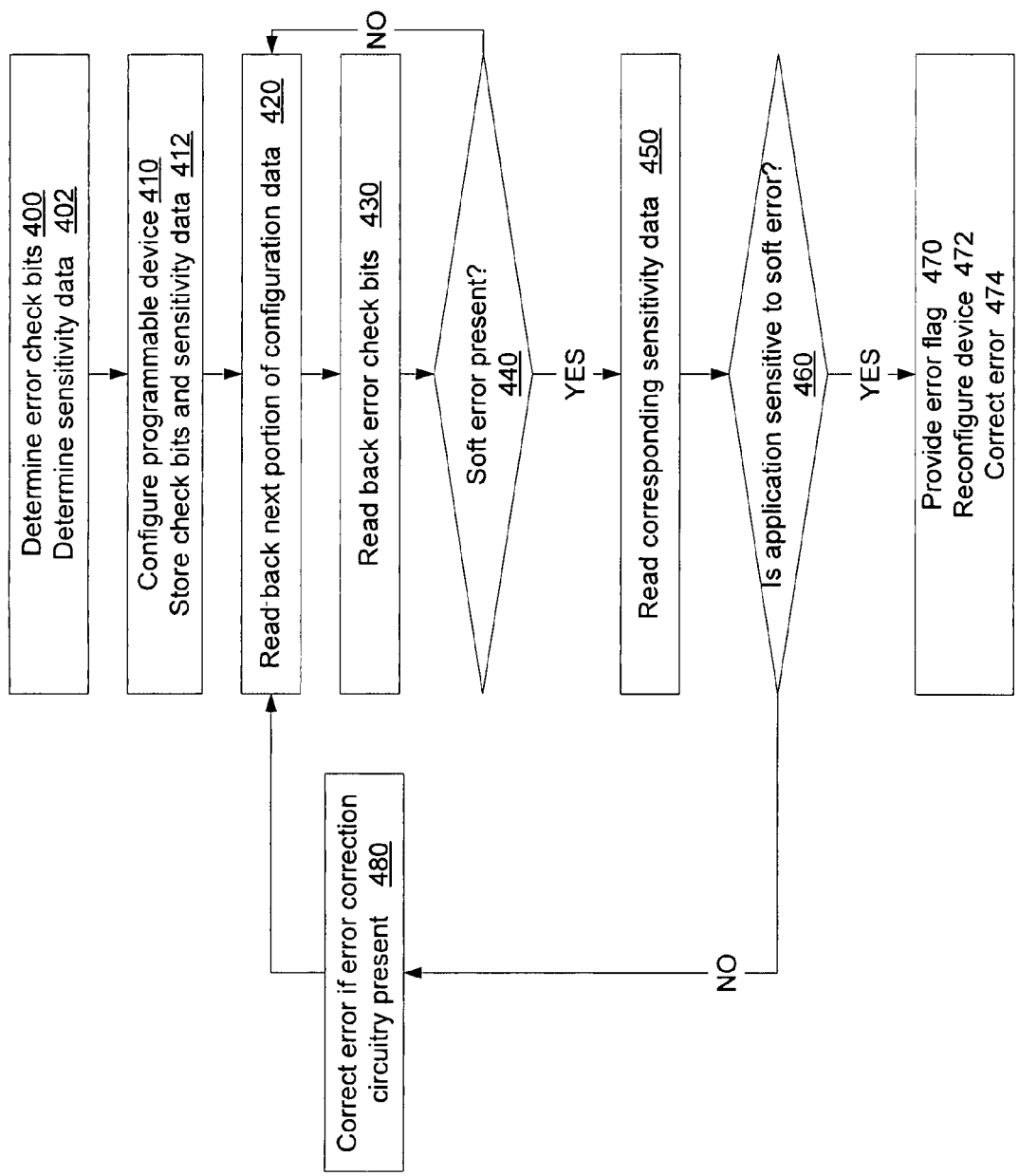
FIG. 4 is a flowchart of a method of detecting errors in configuration memory according to an embodiment of the present invention.

FIG. 4 is a flowchart of a method of detecting errors in configuration memory according to an embodiment of the present invention. In this method, a device is initially configured. Following configuration, checks for soft errors in the configuration data are performed. These checks may be performed on a periodic or aperiodic basis. When an error is detected, it is determined whether the application is sensitive to this error. If the application is not sensitive to this error, the error is ignored. If the application is sensitive to the error, various actions, such as providing a flag, correcting the error, or reconfiguring the device may be performed depending on the exact implementation of the embodiment of the present invention.

Specifically, in act 400, error check bits are determined, and in act 402, sensitivity data is determined, for example, by software. In act 410, the programmable device is configured, and in act 412, the error check bits and sensitivity data are stored on the programmable device. This device may be a programmable device such as a programmable logic device, field programmable gate array, or other device. Again, a device is typically configured by writing configuration data into a number of CRAM cells. After configuration, the data stored in the CRAM cells may be checked for errors. This checking may be done on a regular or periodic basis, it may be done following certain events, or it may be done following some other criteria. In act 420, a portion of the configuration data is read back. In act 430, corresponding error check bits are read back.

In act 440, it is determined whether a soft error has occurred. If no soft error has occurred, the next portion of configuration data may be read back in act 420. If an error has occurred, corresponding sensitivity data is read in act 450. This sensitivity data indicates whether the application is sensitive to the soft error. In a specific embodiment of the present invention, an application is sensitive to an error if the error occurs in a CRAM cell that configures circuitry that is used by the application.

In act 460, it is determined whether the application is sensitive to the soft error. If not, the error may be ignored, and the next configuration data may be read back in act 420. In act 480, if error correction circuitry is present, the error may be corrected if possible even if the application is not sensitive. This prevents errors from accumulating and leading to a situation where later errors that the application is sensitive to cannot be corrected. If the application is sensitive to the error, then depending on be specific implementation of the present invention, various activities may be undertaken. For instance, an error flag may be provided in act 470. Also, or alternately, the device may be reconfigured in act 472. Also, the programmable device may include error correction circuitry. In such a case, the error may be corrected in act 474. If the error can be corrected, the device probably does not need to be reconfigured in act 472.

Again, to save time in reading sensitivity data, for example in act 450, a log of known soft errors for which the application is not sensitive may be kept. This prevents sensitivity data from having to be read each time a CRAM cell having a known soft error that the application is not sensitive to is checked, or reporting the same error repeatedly, in the case that non-sensitive errors are reported. An example is shown in the following flow chart.

Figure 5:
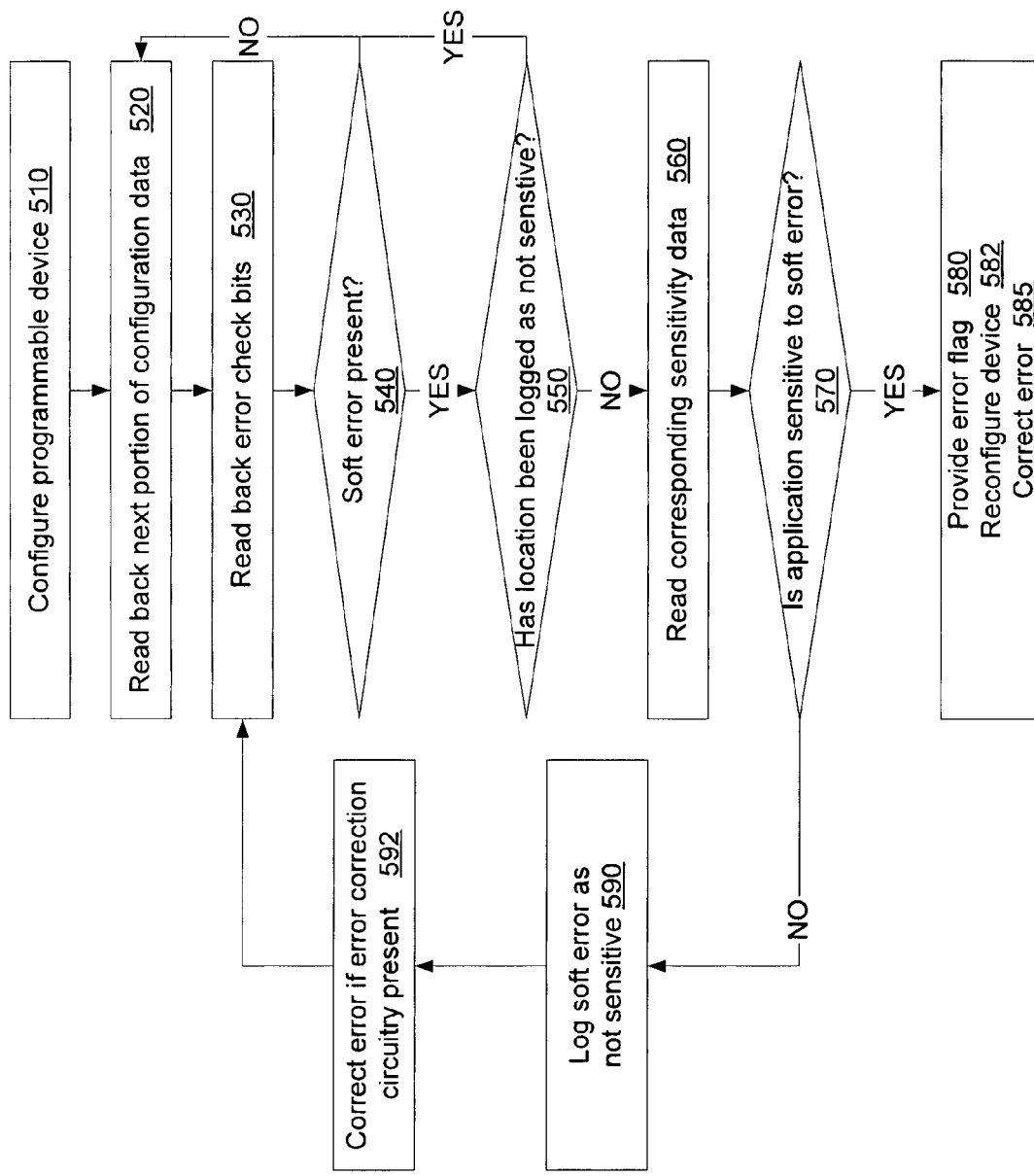
FIG. 5 is another flowchart of a method of detecting errors in configuration memory according to an embodiment of the present invention.

FIG. 5 is a flowchart of the method of a method of detecting errors according to an embodiment of the present invention. Again, a device is initially configured. Following configuration, checks for soft errors in the configuration data are performed. When an error is detected, it is determined whether this error has been previously logged as a known soft error to which the application is not sensitive. If it has been so logged, the error can be ignored, and the checking may proceed. If it has not been logged, it is determined whether the application is sensitive to this error. If the application is not sensitive to this error, the error is logged for future reference and otherwise ignored, or possibly corrected. If the application is sensitive to the error, various actions, such as providing a flag, correcting the error, or reconfiguring the device may be performed depending on the exact implementation of the embodiment of the present invention.

Specifically, in act 510, the programmable device is configured. Again, this may include generation of error check bits, sensitivity data, and the storage of this information and configuration data on the device. In act 520, a portion of the configuration data is read back. In act 530, corresponding error check bits are read back.

In act 540, it is determined whether a soft error has occurred. If no soft error has occurred, the next portion of configuration data may be read back in act 520. If an error has occurred, it is determined in act 550 whether this error has been logged as a soft-error that the application is not sensitive to. If it has been logged, then the error may be ignored and the error check may proceed in act 520. If the soft error has not been logged, then in act 560, corresponding sensitivity data is read. This sensitivity data indicates whether the application is sensitive to the soft error. In act 570, it is determined whether the application is sensitive to the soft error. If not, the error may be logged in act 590 for future reference, and, if error correction circuitry is present, the error can possibly be corrected in act 592, though some errors, such as when multiple bits are in error, cannot be corrected. The next configuration data may be read back in act 520. If the application is sensitive to the error, then depending on be specific implementation of the present invention, various activities may be undertaken.

For instance, an error flag 580 may be provided. Also, or alternately, the device may be reconfigured in act 582. If error correction circuitry is included, the error may be corrected in act 584, in which case the device probably does not need to be reconfigured in act 582.

Figure 6:
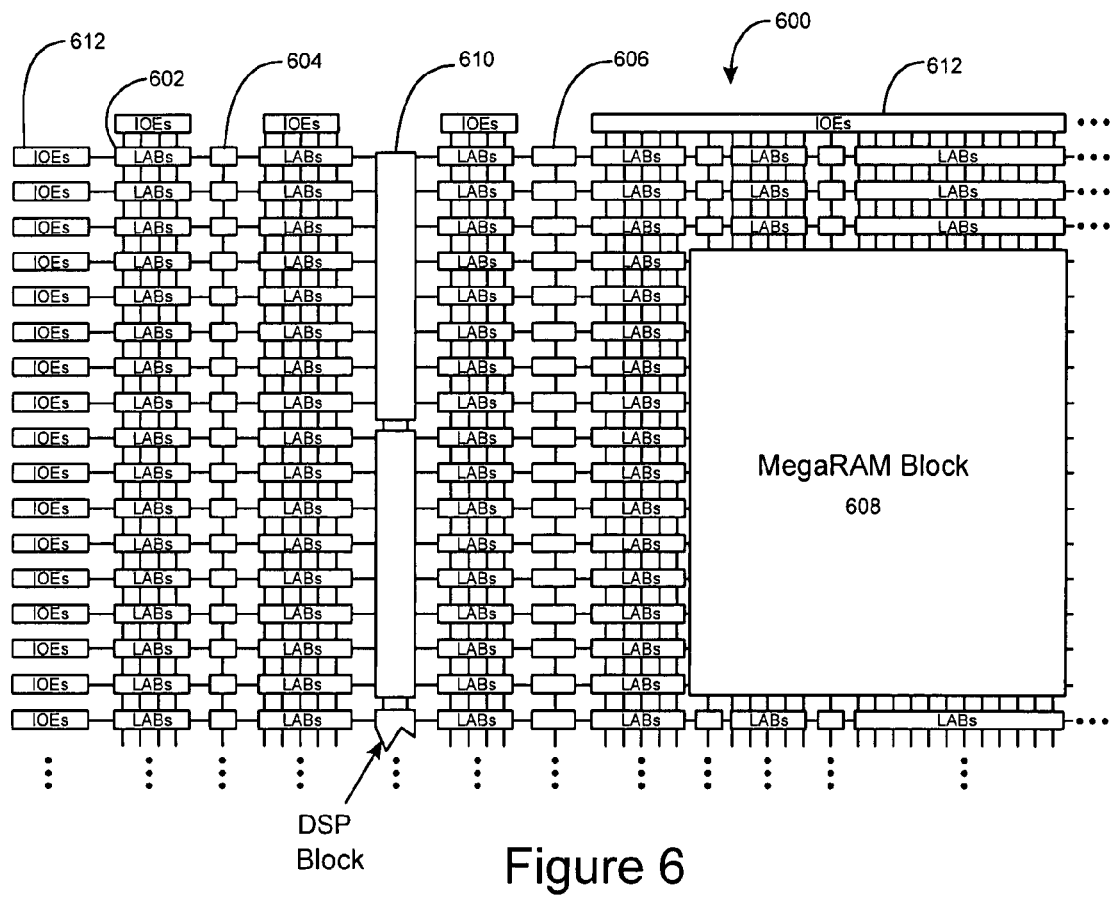
FIG. 6 is a simplified block diagram of a programmable logic device that is improved by incorporating embodiments of the present invention.

FIG. 6 is a simplified partial block diagram of an exemplary high-density programmable logic device or FPGA 600 wherein techniques according to the present invention can be utilized. PLD 600 includes a two-dimensional array of programmable logic array blocks (or LABs) 602 that are interconnected by a network of column and row interconnections of varying length and speed. LABs 602 include multiple (e.g., 10) logic elements (or LEs), an LE being a small unit of logic that provides for efficient implementation of user defined logic functions.

PLD 600 also includes a distributed memory structure including RAM blocks of varying sizes provided throughout the array. The RAM blocks include, for example, 512 bit blocks 604, 4 K blocks 606, and an M-Block 608 providing 512 bits of RAM. These memory blocks may also include shift registers and FIFO buffers. PLD 600 further includes digital signal processing (DSP) blocks 610 that can implement, for example, multipliers with addition or subtraction features.

It is to be understood that PLD 600 is described herein for illustrative purposes only and that the present invention can be implemented in many different types of PLDs, FPGAs, and the other types of digital integrated circuits.

While PLDs or FPGAs of the type shown in FIG. 6 provide many of the resources required to implement system level solutions, the present invention can also benefit systems wherein a PLD is one of several components.

Figure 7:
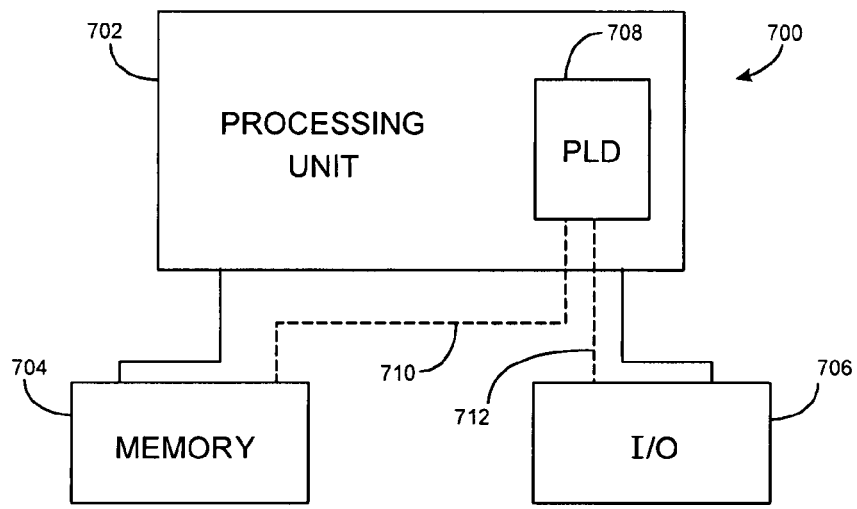
FIG. 7 is a block diagram of an electronic system that is improved by incorporating embodiments of the present invention.

FIG. 7 shows a block diagram of an exemplary digital system 700, within which the present invention may be embodied. System 700 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 700 may be provided on a single board, on multiple boards, or within multiple enclosures.

System 700 includes a processing unit 702, a memory unit 704 and an input/output unit 706 interconnected together by one or more buses. According to this exemplary embodiment, a programmable logic device (PLD) 708 is embedded in processing unit 702. PLD 708 may serve many different purposes within the system in FIG. 7. PLD 708 can, for example, be a logical building block of processing unit 702, supporting its internal and external operations. PLD 708 is programmed to implement the logical functions necessary to carry on its particular role in system operation. PLD 708 may be specially coupled to memory 704 through connection 710 and to input/output unit 706 through connection 712.

Processing unit 702 may direct data to an appropriate system component for processing or storage, execute a program stored in memory 704 or receive and transmit data via input/output unit 706, or other similar function. Processing unit 702 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 708 can control the logical operations of the system. In an embodiment, PLD 708 acts as a reconfigurable processor, which can be reprogrammed as needed to handle a particular computing task. Alternately, programmable logic device 708 may itself include an embedded microprocessor. Memory unit 704 may be a random access memory (RAM), read only memory (ROM), fixed or flexible disk media, PC Card flash disk memory, tape, or any other storage means, or any combination of these storage means.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A method of detecting an error in a configuration memory of a programmable device, the method comprising:
   with the programmable device:
   reading configuration memory data from the configuration memory;
   determining whether an error has occurred in the configuration memory data; and
   in response to the determination that an error has occurred:
   reading sensitivity data corresponding to the configuration memory data that is in error;
   analyzing the sensitivity data to determine whether the error can be ignored; and
   if the error cannot be ignored, then initiating a remedial activity; else
   ignoring the error by not initiating a remedial activity.

2. The method of claim 1, wherein the act of ignoring the error by not initiating a remedial activity further comprises:
   storing a location of the error in an error log.

3. The method of claim 2, wherein the response to the determination that an error has occurred further comprises:
   comparing the location with an error log prior to reading the sensitivity data; and
   reading the sensitivity data only if a location of the error has not been previously stored in the error log.

4. The method of claim 1, wherein whether an error has occurred is determined using error check bits, the configuration memory is partitioned into regions, and error check bits are determined separately for each region.

5. The method of claim 1, wherein the remedial activity includes correcting the error.

6. The method of claim 1, wherein the remedial activity includes reconfiguring the programmable device.

7. The method of claim 1 wherein the sensitivity data is generated in part based on whether a circuit configured by the configuration data in error is used by an application running on the programmable device.

8. A method of checking for errors in configuration data stored in a configuration memory on a programmable device, where the configuration data configures the programmable device for a first application, the method comprising:
   with the programmable device:
   reading a portion of the configuration data from the configuration memory;
   reading a portion of a plurality of error check bits corresponding to the portion of the configuration data;
   determining whether there is a soft error in the portion of the configuration data, and if there is; then determining whether the soft error detrimentally affects the first application, and if it does; then providing an indication that a soft error has occurred; else not providing the indication that a soft error has occurred.

9. The method of claim 8 wherein determining whether the soft error detrimentally affects the first application is done by reading sensitivity data from a memory.

10. The method of claim 8 further comprising:

before reading the portion of the configuration data, reading the configuration data from a configuration device and storing the configuration data in the configuration memory.

11. The method of claim 10 further comprising:

before reading the configuration data from the configuration memory; determining the plurality of error check bits using the configuration data.

12. The method of claim 11 further comprising:

storing the plurality of error check bits on the programmable device.

13. The method of claim 8 further comprising:

if it is determined that the error detrimentally affects the first application, then correcting the soft error.

14. The method of claim 8 further comprising:

if it is determined that the error detrimentally affects the first application, then reconfiguring the programmable device.

15. An integrated circuit comprising:

a first plurality of memory cells to store configuration data;
a second plurality of memory cells to store error check bits;
a third plurality of memory cells to store sensitivity data;
a configuration controller to receive a configuration bitstream comprising the configuration data, error check bits, and sensitivity data, and to write the configuration data in the first plurality of memory cells, the error check bits in the second plurality of memory cells, and the sensitivity data in the third plurality of memory cells;

an error detection circuit to read configuration data from the first plurality of memory cells and error check bits from the second plurality of memory cells, and to determine if an error has occurred in the configuration data, and if so, then to provide at least part of an address for a first one of the first memory cells where the error occurred;

a sensitivity processor to receive the at least part of the address, and to receive sensitivity data corresponding to the at least part of the address, and to determine if an application running on the integrated circuit is sensitive to the error that occurred.

16. The integrated circuit of claim 15 wherein when an error occurs and the application is sensitive to the error, data is written to the memory cell where the error occurred.

17. The integrated circuit of claim 16 further comprising:

an error correction circuit to correct errors detected by the error detection circuit.

18. The integrated circuit of claim 17 wherein the error correction circuit corrects errors detected by the error detection circuit whether or not the application is sensitive to the error that occurred.

19. The integrated circuit of claim 15 wherein when an error occurs and the application is sensitive to the error, the integrated circuit is reconfigured.

20. The integrated circuit of claim 15 wherein the plurality of sensitivity bits are determined in part based on which portions of the programmable device are used by the first application.

21. The integrated circuit of claim 15 wherein each of the sensitivity bits is determined in part based on whether a corresponding portion of the programmable device is used by the first application.

* * * * *